United States Patent [19]

Braun

[11] 4,090,252
[45] May 16, 1978

[54] ROTATIONAL FIELD GENERATOR FOR BUBBLE MEMORY PACKAGE

[75] Inventor: Roland Joseph Braun, Vestal, N.Y.

[73] Assignee: International Business Machines Corporation, Armonk, N.Y.

[21] Appl. No.: 731,607

[22] Filed: Oct. 13, 1976

[51] Int. Cl.² .............................................. G11C 19/08
[52] U.S. Cl. ........................................................ 365/2
[58] Field of Search ................................. 340/174 TF

[56] References Cited

PUBLICATIONS

IEEE Transactions on Magnetics-Mag-10, No. 3, Sep. 1974, pp. 753-756.

*Primary Examiner*—James W. Moffitt
*Attorney, Agent, or Firm*—Cyril A. Krenzer

[57] ABSTRACT

For a bubble memory package, the two conductors operative to generate the rotational magnetic field consist of two thin, solid disks with a number of current contact points around their respective peripheries. Then, by selectively advancing the current injection-/extraction points around the periphery, the current through the disks and thus the associated magnetic field can be rotated over a full 360° thereby generating the rotational magnetic field required to effect the domain propagation necessary to the operation and function of a bubble memory device.

7 Claims, 6 Drawing Figures

ROTATIONAL FIELD GENERATOR FOR BUBBLE MEMORY PACKAGE

BACKGROUND OF THE INVENTION

1. Field of the Invention

This invention relates generally to stored memory packages, and more particularly to an improved rotational field generating apparatus for a bubble memory package.

2. Prior Art

A rotating magnetic field is a preferred method for propagation of magnetic bubbles in a bubble memory package. Customarily, this rotational magnetic field is generated using flat coils or stripline coils, one mounted on top of the other, but physically displaced 90° relative to each other, and are driven by a sinusoidal or triangular current with appropriate phase shift of 90% at a frequency of between one hundred kilohertz and one megahertz to provide the desired inplane rotational field. A typical example of such a rotational field generation package is found in the bubble devices described in the article entitled "Reflection Coil Packaging for Bubble Devices" by Masaki Takasu, Harumi Maegawa, Toshiaki Sukeda and Kazuo Yamagishi of the Fujitsu Laboratories, Ltd., Kawasaki, Japan, which was published in the IEEE Transaction on Magnetics, Volume MAG-11, Number 5, September 1975. In this package, the structure uses an upper pair of flat coils and a lower pair of flat coils, each pair being oriented orthogonal to each other. Then, by selectively varying the phase and magnitude of the current's pulse through the respective coils, an effective rotating magnetic field is produced between the pairs in the area containing the bubble memory chips. A primary difficulty encountered with these and similar prior art bubble memory coil packages are that the coils are expensive, space consuming and quite often hard to assemble. They may exhibit relatively high inductances which complicate operations at high frequencies. In addition, special high-power circuits are needed to meet the start/stop requirements of the systems without overshoot or ringing occurring, and to contain inherent high over-voltages. Generally, rather elaborate shielding of the drive lines, circuitry and coils to protect the sensitive bubble sense circuits is also required.

It is also quite important that the coil characteristics be closely matched and carefully controlled. This becomes especially difficult in that for each pair, one of the coils is further removed from the active zone of the bubble memory chips than the companion coil and therefore to provide the same effect on the rotational magnetic field, its design and/or control compensation must be carefully managed to accomplish the desired magnetic field effects.

OBJECTS AND SUMMARY OF THE INVENTION

Accordingly, it is a principal object of this invention to provide an improved bubble memory rotational field generator which overcomes the foregoing disadvantages of the prior art.

Another object of the present invention is to provide an improved bubble memory generator which obviates the need for using paired coils to accomplish a rotating magnetic field.

Yet another object of the present invention is to provide an improved bubble memory generator which has simplified, symmetrical design characteristics which minimize the need for compensation.

Yet another object of the present invention is to provide an improved bubble memory magnetic field generator which economically and uniformly generates a prescribed magnetic field.

The foregoing and other objects are accomplished according to one aspect of the invention, which utilizes the fact that the magnetic field between two flat, closely spaced conductors is perpendicular to the current in the conductors, parallel to the flat surfaces of the conductors and is homogenous between the two conductors as long as the width of the conductors is substantially greater than the spacing therebetween. Each conductor consists of a thin, solid conductive disk with a number of current contact injection points around its periphery. The rotation of the current is accomplished over a full 360° by consecutively advancing the current injection-/extraction points around the periphery and with a large enough number of contact points, a uniform field density is achievable over a relatively large center area.

DESCRIPTION OF THE PREFERRED EMBODIMENTS

The foregoing and other objects, features and advantages of the invention will be apparent from the following more particular description of the preferred embodiments of the invention taken in junction with the above-described accompanying drawings.

Figure 1:
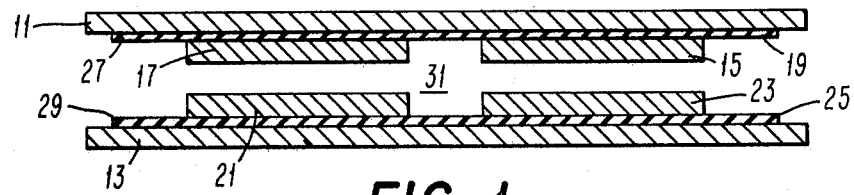
FIG. 1 is a cross-sectional view of an assembled bubble memory package with the rotational field generation means according to the present invention.

Referring first to FIG. 1, the bubble memory package according to the present invention includes a pair of oppositely disposed conductive disks 11, 13 with bubble memory devices 15, 17 attached to disk 11 via an insulative member 19 and bubble memory devices 21, 23 attached to disk 13 via insulative material 25. The lower surface 27 of insulator 19 and the upper surface 29 of insulator 25 will include appropriate circuitization (not shown) which will enable signals, power, etc. to be sent to and derived from the bubble memory devices 15, 17, 21 and 23. The package will include additional shielding material, enclosures, magnetic biasing members, etc. as shown in the aforementioned publication in the IEEE Magazine and as shown in co-pending application Ser. No. 689,278 now U.S. Pat. No. 4,027,300 assigned to the assignee of the present invention.

Figure 2:
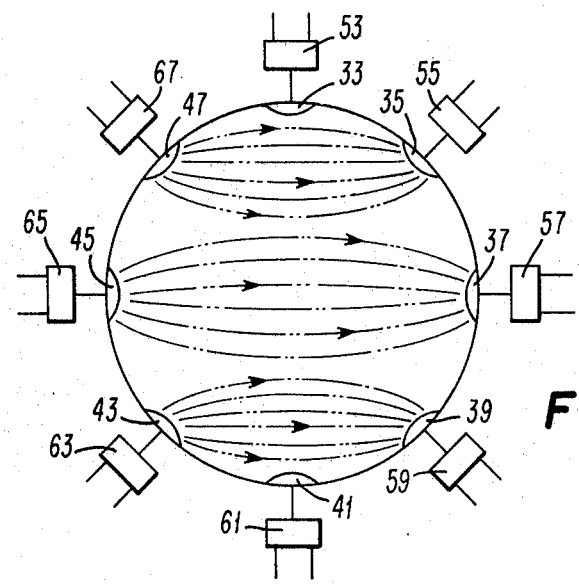
FIGS. 2–4 are top views, partially in schematic, of a disk current generator with discrete current injection points affective to generate a rotational magnetic field according to the present invention.
Figure 3:
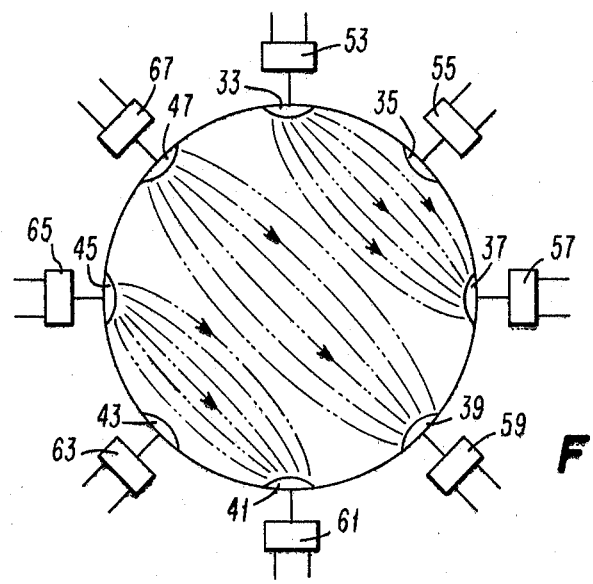
Figure 4:
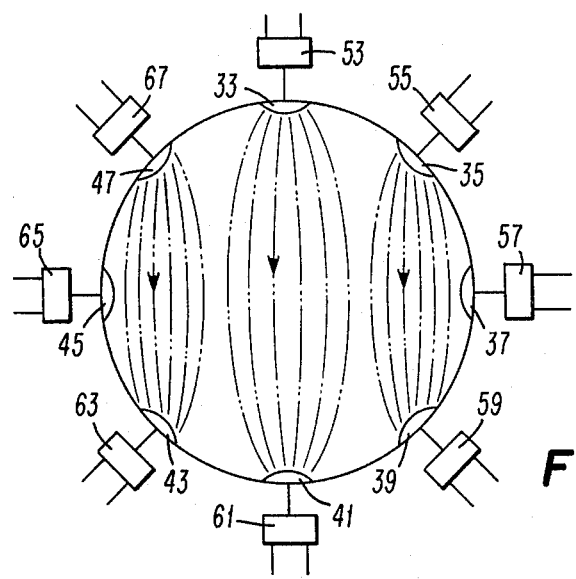

Referring next to FIGS. 2–4, there is shown a sequential current switching mode of operation which has the effect of providing a rotational electric field across the surface of the disk, which will in turn effect a rotational magnetic field in the space 31 of FIG. 1 between the two disks and approximate the surfaces of the magnetic bubble memory devices 15, 17, 21 and 23. As seen in FIG. 2, there are a number of current injection points 33, 35, 37, 39, 41, 43, 45 and 47. Attached to each of the signal injection points is a respective control member 53, 55, 57, 59, 61, 63, 65 and 67. Illustrated in FIG. 2, control members 67 and 55 are gated such that current will flow as indicated by the lines between injection point 47 and point 35. Similarly, control members 65 and 57 are gated to yield a current flow between injection point 45 and point 37 and control members 63 and 59 are gated to yield a current flow between point 43 and point 39. In the next sequence shown in FIG. 3, the switching points have been changed so that devices 53 and 57 are selectively activated to provide a current path between points 33 and 37; devices 67 and 59 are activated to provide current paths between points 47 and 39; and, devices 65 and 61 are activated to provide current paths between points 45 and 41. Then, in the next sequence shown in FIG. 4, the devices 55 and 59 are activated to provide current paths between points 35 and 39; devices 53 and 61 are activated to provide current paths between points 33 and 41; and devices 67 and 63 are activated to provide current paths between points 47 and 43. Therefore, in the sequence occurring from FIG. 2 to FIG. 4, the current path across the surface of the disk has been rotated by 90°. By continuing the selective activation of the control devices, the surface currents can be continually rotated through an effective 360° pattern.

As illustrated in FIGS. 2-4, during each sequential switching of the current activation points, there are three simultaneous current paths across the disk at any one time. In other words as shown in FIG. 2, current paths 47-35, 45-37, and 43-39 are activated at the same time. During the next sequence as shown in FIG. 3 current paths 33-37, 47-39 and 45-41 are activated simultaneously. And in FIG. 4 current paths 47-43, 33-41 and 35-39 are simultaneously activated.

Figure 5:
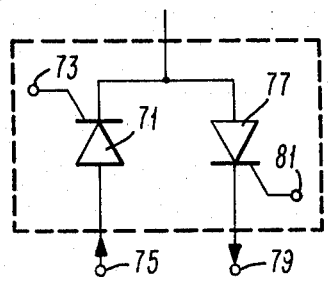
FIG. 5 is a schematic diagram of a drive circuit operative to be used with the disk current generators of FIGS. 2–4 according to the present invention.
Figure 6:
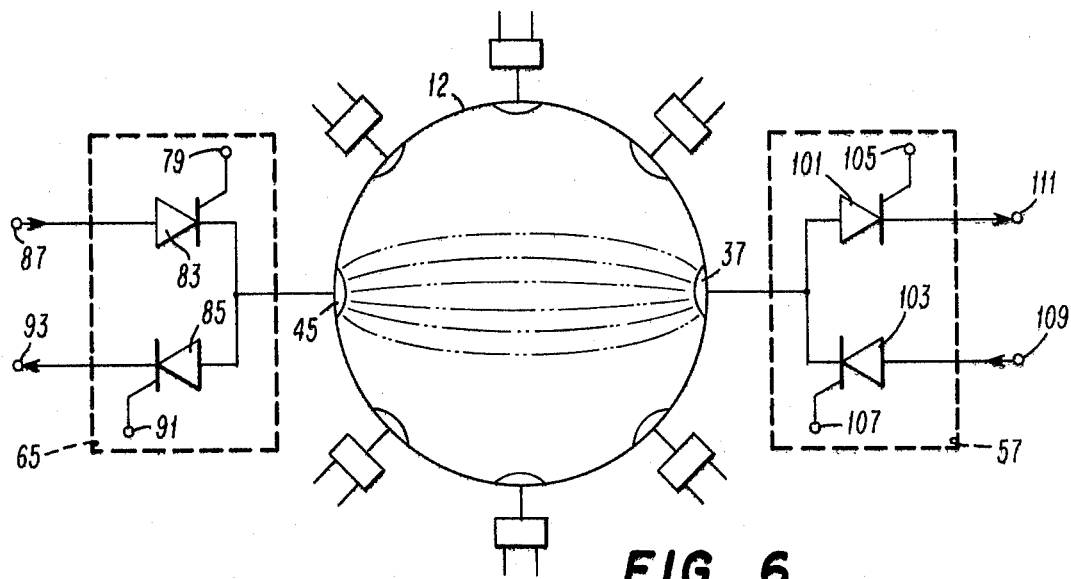
FIG. 6 is a partial schematic diagram showing connections of drive circuitry to a disk current generator according to the present invention.

The switching circuit devices, shown as "black boxes" in FIGS. 2-4, being operative to produce the rotational field can utilize any switching device which provides the desired speed, space, power dissipation and control necessary to affect the rotational electric field. Solid state switches, possibly combined with an amplifier and selection circuitry, would be appropriate or in the alternative thyratron type semiconductor switches can be used. A particular circuit arrangement is shown in FIG. 5 which uses a pair of oppositely poled SCR devices as the switching apparatus. As illustrated, SCR 71 has its anode connected to the lead going to an injection point under the control of its gate 73 with the input being applied at terminal 75 to the SCR cathode. The oppositely poled SCR 77 has its cathode connected to the lead going to the injection point and its anode connected to an output terminal 79 under the control of a gate 81. A more specific implementation of the circuit of FIG. 5 is illustrated in FIG. 6. For simplicity, the controls going to only two injection points are illustrated but it will be understood that similar pairs will be connected to the remaining injection points. In FIG. 6, the injection point 45 is connected to the anode of SCR 83 and to the cathode of SCR 85. The cathode of SCR 83 is connected to a terminal 87 going to a suitable source of energizing potential. SCR 83 is adapted to receive suitable control signals at its gate 89 and similarly, SCR 85 is adapted to receive suitable control signals at its gate 91. The anode of SCR 85 is connected to a suitable return signal potential via terminal 93. Similarly, injection point 37 is connected to the cathode of SCR 101 and to the anode of SCR 103 with their respective gates 105 and 107 under the control of suitable gating pulses. The cathode of SCR 103 is connected via terminal 109 to a suitable source of energizing potential and the anode of SCR 101 is connected via terminal 110 to a suitable source of return potential.

In order to generate a unidirectional signal across the surface of the disk 12 between points 45 and 37, one of each pair of the SCRs in the control devices 65 and 57 are selectively activated. For example, to provide a unilateral signal current running from point 45 to point 37, a suitable gating pulse is applied to the gates 89 of SCR 83 and a similar gating pulse is applied to the gate 105 of SCR 101. Simultaneously, a suitable potential is applied between the terminal 111 going to the anode of SCR 101 and terminal 87 going to the cathode of SCR 83. This can be in the form of a predetermined pulse amplitude of proscribed duration which will therefore induce a unilateral current going from injection point 45 to point 37 and provide the desired current and resultant magnetic field. To reverse the current by 180°, SCRs 103 and 85 are activated in the same fashion, but with reversed polarities applied to the terminals 93 and 109.

In this fashion by selectively controlling the gates of the switching devices connected to the various signal injection points on the periphery of the conductive disk 12, a rotational electrical field with the incident rotational magnetic field is generated.

The present invention makes use of the fact that the magnetic field strength between two flat, closely spaced conductors is perpendicular to the current in the conductor, parallel to the flat surface of the conductor and homogenous between the two conductors, so long as the width of the conductor is very much greater than the spacing between the conductors. For example, referring back to FIG. 1, it is apparent that the spacing between the disk 11 and 13 is very much smaller than the width of the two conductors. In order to reduce skin effects in the system, the thickness of the disk will be on the order of a few mils thick.

With the configuration of FIG. 1, the current switching devices are activated in such a manner that the currents through disk 11 are substantially equal in magnitude, but opposite in direction to the currents in disk 13. Therefore, as the currents are switched by sequential rotational activation, they produce substantially the same effect as a rotating field coil generating the rotational magnetic field in the plane of the bubble memory devices. The rotational uniformity of the magnetic field can be increased by increasing the number of current contact points around the circumferences of the disks.

In conjunction with the present invention, it is contemplated that several disk/bubble-memory layers can be stacked on the top of one another, providing a compact package design with a maximum containment of the magnetic fields, with an efficient use of the drive current and high volumetric memory capacity.

In order to produce a uniform field of between 30 and 50 oersted, for example, between the disks 11, 13, a current of about 24 to 40 amperes per centimeter disk diameter has to flow through each disk. However, this current is distributed among the switching devices that are on at any one time and each device switches on and off once during each rotational period with a proscribed duty cycle. Obviously since the total amount of current stays constant, several disks can be connected in series and stacked, since the power supply has to deliver a d.c. current only.

Although a particular embodiment has been shown and described, it will be understood that certain changes can be made depending on system requirements or design preference. For example, an increase in the number of injection points and the integration of the switching components on a semiconductor layer attached to the conductor are examples of such changes. Also, it may be possible in a given system configuration to use only one conductive disk to generate the desired rotational field, effectively replacing the second conductive disk with a suitable reflection plate Therefore, while the invention has been particularly shown and described with reference to a preferred embodiment thereof, it will be understood by those skilled in the art that various changes in form and details may be made therein without departing from the spirit and scope of the invention.

I claim:

1. A modular subassembly for field accessed bubble memory devices, comprising:
    at least one level of bubble memory devices;
    at least one solid disk having a plurality of contact points positioned on its circumference;
    means for positioning and supporting said bubble memory devices proximate said conductive disk; and
    current switching means operative to sequentially establish electrical currents between selected pairs of said contact points to thereby effect a rotational magnetic field through said bubble memory devices operative to propogate magnetic bubble domains in said devices.

2. The invention according to claim 1 additionally comprising at least one reflection plate with said bubble memory devices being positioned and supported between said conductive disk and said reflection plate.

3. The invention according to claim 2 wherein the diameters of said disk and plate are very much greater than the spacing between said disk and plate.

4. A modular subassembly for field accessed bubble memory devices, comprising:
    at least one level of bubble memory devices;
    first and second solid disks, each having a plurality of contact points positioned on its circumference;
    means for positioning and supporting said bubble memory devices between said conductive disks, the spacing between said disks being much smaller than the diameters of said disks; and,
    current switching means operative to sequentially establish electrical currents between selected pairs of said contact points on each of said disks with each current in said first disk being of approximately equal magnitude, but opposite in direction to the respective current in said second disk to thereby establish a uniform rotating magnetic field between said disks to propogate magnetic bubbles in said bubble memory devices.

5. The invention according to claim 4 comprising at least one additional level of bubble memory devices, said first level of bubble memory devices being supported by said first disk and said second level of bubble memory devices being supported by said second disk.

6. The invention according to claim 4 comprising at least a second level of bubble memory devices and a third disk, said second level of bubble memory devices being positioned and supported between said second and third disks.

7. The invention according to claim 6 wherein said third disk has a like plurality of contact points positioned on its circumference and said switching means is operative to sequentially establish electrical currents between selected pairs of said contact points on said third disk with each current in said third disk being of approximately equal magnitude, but opposite in direction to the respective current in said second disk.

* * * * *